United States Patent
Khlat

(10) Patent No.: US 12,244,275 B2
(45) Date of Patent: Mar. 4, 2025

(54) RADIO FREQUENCY SIGNAL PHASE CORRECTION IN POWER AMPLIFIER CIRCUIT

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 518 days.

(21) Appl. No.: 17/564,734

(22) Filed: Dec. 29, 2021

(65) Prior Publication Data

US 2022/0368294 A1 Nov. 17, 2022

Related U.S. Application Data

(60) Provisional application No. 63/188,019, filed on May 13, 2021.

(51) Int. Cl.
*H03F 3/24* (2006.01)
*H03H 11/16* (2006.01)

(52) U.S. Cl.
CPC ............. *H03F 3/245* (2013.01); *H03H 11/16* (2013.01); *H03F 2200/105* (2013.01); *H03F 2200/451* (2013.01)

(58) Field of Classification Search
CPC ............... H03F 3/245; H03F 2200/105; H03F 2200/45; H03H 11/16
USPC ........................................................ 330/291
See application file for complete search history.

(56) References Cited

U.S. PATENT DOCUMENTS

| | | | |
|---|---|---|---|
| 6,621,433 B1 | 9/2003 | Hertz | |
| 7,546,137 B2 | 6/2009 | D'Hont et al. | |
| 7,977,919 B1 | 7/2011 | Jaoude et al. | |
| 9,577,771 B1* | 2/2017 | Lashkarian | ............... H03F 3/19 |
| 9,755,579 B1* | 9/2017 | Ahmed | ................. H03F 1/3241 |
| 11,165,515 B2* | 11/2021 | Tiebout | .................. H04B 17/13 |
| 2007/0189417 A1 | 8/2007 | Waheed et al. | |
| 2012/0140852 A1 | 6/2012 | Kato et al. | |
| 2016/0164551 A1 | 6/2016 | Khlat et al. | |
| 2016/0249300 A1 | 8/2016 | Tsai et al. | |
| 2022/0069774 A1 | 3/2022 | Emira et al. | |
| 2022/0368283 A1 | 11/2022 | Folkmann et al. | |
| 2022/0368293 A1 | 11/2022 | Khlat | |
| 2022/0368295 A1 | 11/2022 | Khlat | |

(Continued)

OTHER PUBLICATIONS

U.S. Appl. No. 17/536,189, filed Nov. 29, 2021.

(Continued)

*Primary Examiner* — Hafizur Rahman
(74) *Attorney, Agent, or Firm* — Withrow & Terranova, P.L.L.C.

(57) ABSTRACT

A power amplifier circuit supporting phase correction in a radio frequency (RF) signal is disclosed. The power amplifier circuit includes a power amplifier configured to amplify an RF signal based on a modulated voltage. The power amplifier circuit also includes a phase correction circuit configured to generate a phase correction signal based on the modulated voltage to thereby cause a phase change in the RF signal before the RF signal is amplified by the power amplifier. As a result, the modulated voltage and the time-variant power envelope can be better aligned in time and/or phase at the power amplifier circuit to thereby improve efficiency and linearity of the power amplifier circuit.

17 Claims, 3 Drawing Sheets

(56) References Cited

U.S. PATENT DOCUMENTS

2022/0368300 A1 11/2022 Khlat
2023/0080652 A1 3/2023 Khlat et al.

OTHER PUBLICATIONS

U.S. Appl. No. 17/564,852, filed Dec. 29, 2021.
U.S. Appl. No. 17/536,234, filed Nov. 29, 2021.
U.S. Appl. No. 17/552,791, filed Dec. 16, 2021.
Non-Final Office Action for U.S. Appl. No. 17/552,791, mailed Jun. 21, 2024, 6 pages.
Non-Final Office Action for U.S. Appl. No. 17/536,189, mailed Oct. 1, 2024, 12 pages.
Non-Final Office Action for U.S. Appl. No. 17/564,852, mailed Oct. 1, 2024, 9 pages.
Non-Final Office Action for U.S. Appl. No. 17/536,234, mailed Oct. 16, 2024, 17 pages.
Notice of Allowance for U.S. Appl. No. 17/552,791, mailed Oct. 15, 2024, 7 pages.

* cited by examiner

RADIO FREQUENCY SIGNAL PHASE CORRECTION IN POWER AMPLIFIER CIRCUIT

RELATED APPLICATIONS

This application claims the benefit of provisional patent application Ser. No. 63/188,019, filed May 13, 2021, the disclosure of which is hereby incorporated herein by reference in its entirety.

FIELD OF THE DISCLOSURE

The technology of the disclosure relates generally to a power amplifier circuit configured to enable phase correction in a radio frequency (RF) signal.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

A fifth-generation new radio (5G-NR) wireless communication system is widely regarded as a technological advancement that can achieve significantly higher data throughput, improved coverage range, enhanced signaling efficiency, and reduced latency compared to the existing third-generation (3G) and fourth-generation (4G) communication systems. A 5G-NR mobile communication device usually transmits and receives a radio frequency (RF) signal(s) in a millimeter wave (mmWave) RF spectrum that is typically above 6 GHz. Notably, the RF signal(s) transmitted in the mmWave RF spectrum may be more susceptible to propagation attenuation and interference that can result in substantial reduction in data throughput. To help mitigate propagation attenuation and maintain desirable data throughput, the 5G-NR mobile communication device employs a power amplifier(s) to amplify the RF signal(s) before transmitting in the mmWave RF spectrum.

Envelope tracking (ET) is a power management technique designed to improve operating efficiency of the power amplifier(s). Specifically, the power amplifier(s) is configured to amplify the RF signal(s) based on a time-variant ET voltage that closely tracks a time-variant power envelope of the RF signal(s). The time-variant voltage is typically generated by an ET integrated circuit (ETIC) in the wireless communication device. Notably, the inherent processing delay associated with the ETIC can inadvertently cause the time-variant ET voltage to misalign in time and/or phase with the time-variant power envelope of the RF signal(s). As a result, the peaks of the time-variant ET voltage may become misaligned with the peaks of the time-variant power envelope, which may cause the power amplifier(s) to clip and distort the RF signal(s). In this regard, it is desirable to ensure that the ETIC can maintain good time and phase alignment between the time-variant ET voltage and the time-variant power envelope of the RF signal(s).

SUMMARY

Aspects disclosed in the detailed description include a power amplifier circuit supporting phase correction in a radio frequency (RF) signal. The power amplifier circuit includes a power amplifier configured to amplify an RF signal based on a modulated voltage. The power amplifier circuit also includes a phase correction circuit configured to generate a phase correction signal based on the modulated voltage to thereby cause a phase change in the RF signal before the RF signal is amplified by the power amplifier. As a result, the modulated voltage and the time-variant power envelope can be better aligned in time and/or phase at the power amplifier circuit to thereby improve efficiency and linearity of the power amplifier circuit.

In one aspect, a power amplifier circuit is provided. The power amplifier circuit includes a power amplifier. The power amplifier is configured to amplify an RF signal based on a modulated voltage. The power amplifier circuit also includes a phase correction circuit. The phase correction circuit is configured to generate a phase correction signal based on the modulated voltage to thereby cause a phase change in the RF signal.

In another aspect, a power management circuit is provided. The power management circuit includes a power amplifier circuit. The power amplifier circuit includes a power amplifier. The power amplifier is configured to amplify an RF signal based on a modulated voltage. The power amplifier circuit also includes a phase correction circuit. The phase correction circuit is configured to generate a phase correction signal based on the modulated voltage to thereby cause a phase change in the RF signal. The power management circuit also includes an envelope tracking integrated circuit (ETIC). The ETIC is configured to generate the modulated voltage based on a modulated target voltage.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
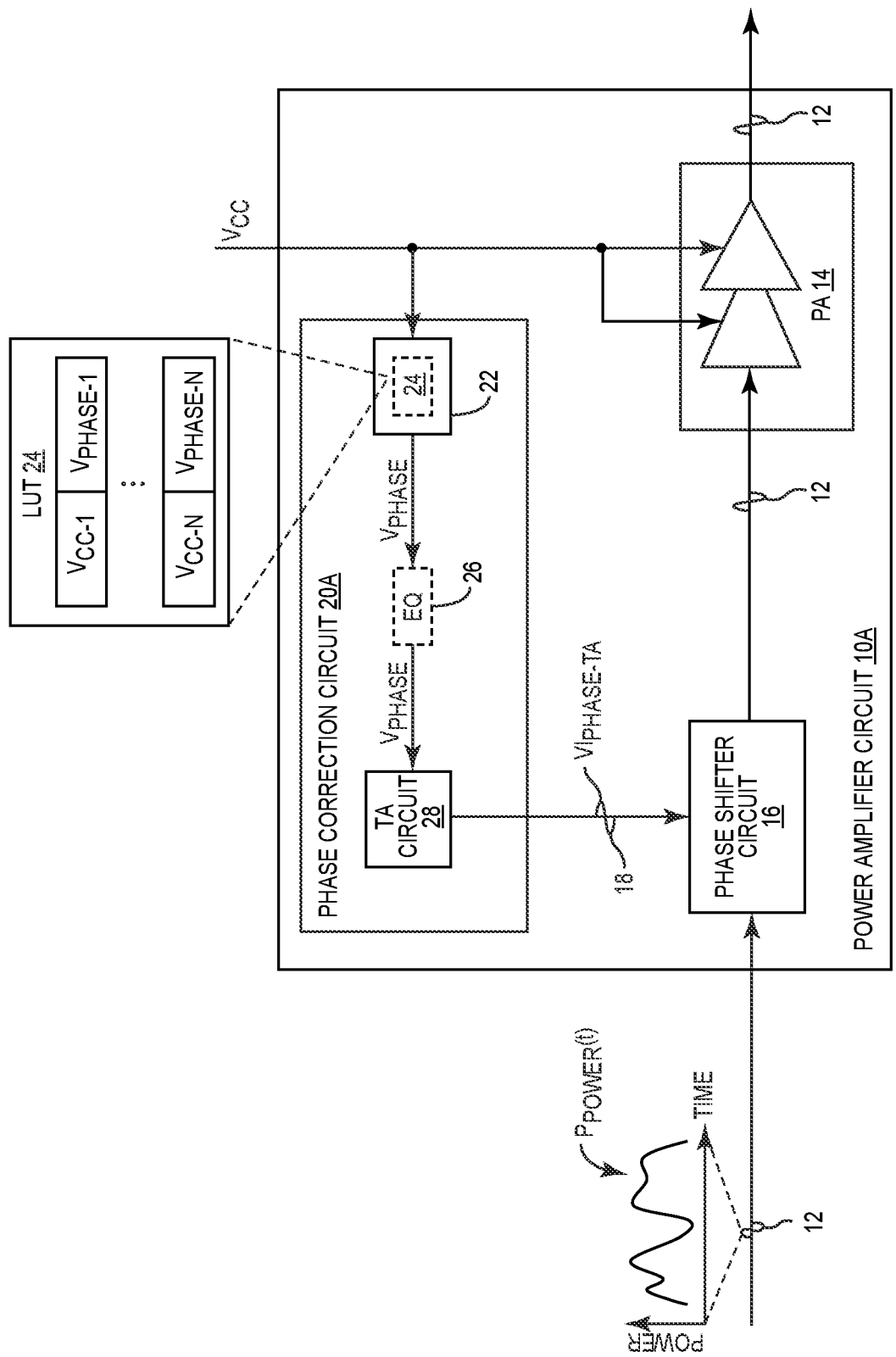
FIG. 1 is a schematic diagram of an exemplary power amplifier circuit configured according to an embodiment of the present disclosure to support phase correction in a radio frequency (RF) signal.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include a power amplifier circuit supporting phase correction in a radio frequency (RF) signal. The power amplifier circuit includes a power amplifier configured to amplify an RF signal based on a modulated voltage. The power amplifier circuit also includes a phase correction circuit configured to generate a phase correction signal based on the modulated voltage to thereby cause a phase change in the RF signal before the RF signal is amplified by the power amplifier. As a result, the modulated voltage and the time-variant power envelope can be better aligned in time and/or phase at the power amplifier circuit to thereby improve efficiency and linearity of the power amplifier circuit.

FIG. 1 is a schematic diagram of an exemplary power amplifier circuit 10A configured according to an embodiment of the present disclosure to support phase correction in an RF signal 12. The power amplifier circuit 10A includes a power amplifier 14, which can be any type of power amplifier (e.g., Doherty power amplifier, multi-stage power amplifier, single-stage power amplifier, etc.). The power amplifier 14 is configured to amplifier the RF signal 12 based on a modulated voltage $V_{CC}$ that is so generated to track a time-variant power envelope $P_{POWER}(t)$ of the RF signal 12.

In a non-limiting example, the RF signal 12 and the modulated voltage $V_{CC}$ can be generated by different circuits that are physically separated. In this regard, the RF signal 12 and the modulated voltage $V_{CC}$ can arrive at the power amplifier 14 via different paths. As a result, the time-variant power envelope $P_{POWER}(t)$ of the RF signal 12 and the modulated voltage $V_{CC}$ can become misaligned in phase when arriving at the power amplifier 14. Such misalignment can cause amplitude distortion in the RF signal 12 and/or performance degradation in the power amplifier 14. Hence, it is necessary to perform phase correction in the RF signal 12 to thereby align the time-variant power envelope $P_{POWER}(t)$ with the modulated voltage $V_{CC}$.

In this regard, the power amplifier circuit 10A is further configured to include a phase shifter circuit 16 to phase-shift the RF signal 12 before the RF signal 12 is amplified by the power amplifier 14. More specifically, the phase shifter circuit 16 is configured to phase-shift the RF signal 12 based on a phase correction signal 18 (e.g., a voltage signal or a current signal) that is derived from the modulated voltage $V_{CC}$. Thus, by exploring a relationship between the time-variant power envelope $P_{POWER}(t)$, the modulated voltage VCC, and the phase correction signal 18, it is possible to enable good phase alignment between the modulated voltage $V_{CC}$ and the time-variant power envelope $P_{POWER}(t)$ to thereby improve efficiency and linearity of the power amplifier 14.

The power amplifier circuit 10A includes a phase correction circuit 20A. The phase correction circuit 20A is configured to generate the phase correction signal 18 based on the modulated voltage $V_{CC}$ and provide the phase correction signal 18 to the phase shifter circuit 16.

The power amplifier circuit 10A is configured to explore a correlation between the time-variant power envelope $P_{POWER}(t)$, the modulated voltage $V_{CC}$, and the phase correction signal 18 such that the modulated voltage $V_{CC}$ can be generated as a function of the time-variant power envelope $P_{POWER}(t)$ and the phase correction signal 18 can be generated as a function of the modulated voltage $V_{CC}$. For a more detailed explanation on such correction, please refer to U.S. patent application Ser. No. 17/536,189, entitled "POWER MANAGEMENT CIRCUIT SUPPORTING PHASE CORRECTION IN AN ANALOG SIGNAL" (hereinafter referred to as "APP189").

The phase correction circuit 20A includes a phase correction voltage circuit 22. The phase correction voltage circuit 22 is configured to generate a modulated phase correction voltage $V_{PHASE}$ based on the modulated voltage $V_{CC}$. Specifically, the phase correction voltage circuit 22 may be configured to generate the modulated phase correction voltage $V_{PHASE}$ based on a phase correction voltage lookup table (LUT) 24 configured to correlate various levels of the modulated phase correction voltage $V_{PHASE}$ with various levels of the modulated voltage $V_{CC}$. In an embodiment, the phase correction voltage LUT 24 includes multiple phase correction voltages $V_{PHASE-1}$-$V_{PHASE-N}$, each corresponding to a respective one of multiple modulated voltage levels $V_{CC-1}$-$V_{CC-N}$. In a non-limiting example, the modulated voltage levels $V_{CC-1}$-$V_{CC-N}$ are stored in the phase correction voltage LUT 24 in an ascending order ($V_{CC-1} < V_{CC-2} < \ldots < V_{CC-N}$).

In this regard, the phase correction voltage circuit 22 may select one of the phase correction voltages $V_{PHASE-1}$-$V_{PHASE-N}$ from the phase correction voltage LUT 24 based on a respective level of the modulated voltage $V_{CC}$ and output the selected one of the phase correction voltages $V_{PHASE-1}$-$V_{PHASE-N}$ as the phase correction voltage $V_{PHASE}$. As an example, if the respective level of the modulated voltage $V_{CC}$ is greater than or equal to the modulated voltage level $V_{CC-1}$ but less than the modulated voltage level $V_{CC-2}$ ($V_{CC-1} \leq V_{CC} < V_{CC-2}$), the phase correction voltage circuit 22 may select and output the phase correction voltage $V_{PHASE-1}$ as the modulated phase correction voltage $V_{PHASE}$.

The phase correction circuit 20A may include a voltage equalizer circuit 26 (denoted as "EQ") to equalize the modulated phase correction voltage $V_{PHASE}$. Specifically, the voltage equalizer circuit 26 may help smooth out ripples in the modulated phase correction voltage $V_{PHASE}$, which may result from, for example, trace inductance and/or capacitance.

Since the modulated phase correction voltage $V_{PHASE}$ is generated based on the modulated voltage $V_{CC}$, there is a likelihood that the modulated phase correction voltage $V_{PHASE}$ will lag behind the modulated voltage $V_{CC}$ in time. As such, the phase correction circuit 20A can be configured to include a time advance circuit 28. Specifically, the time advance circuit 28 can be configured to time advance the modulated phase correction voltage $V_{PHASE}$ by a selected time advance value to generate a time-advanced modulated phase correction voltage $V_{PHASE-TA}$ that is time aligned with the modulated voltage $V_{CC}$. For an in-depth description as to how the time advance circuit 28 operates, please refer to U.S. patent application Ser. No. 17/536,234, entitled "TIME-ADVANCED PHASE CORRECTION IN A POWER AMPLIFIER CIRCUIT."

In an embodiment, the phase correction circuit 20A may output the time-advanced modulated phase correction voltage $V_{PHASE-TA}$ in the phase correction signal 18. In this regard, the phase shifter circuit 16 may be configured to determine a phase shift corresponding to the time-advanced modulated phase correction voltage and phase-shift the RF signal 12 based on the determined phase shift.

In an embodiment, the phase shifter circuit 16 can include internal storage (not shown), such as registers for example, to store a correlation between various levels of the time-advanced modulated phase correction voltage $V_{PHASE-TA}$ and various degrees of phase shift. For example, the time-advanced modulated phase correction voltage $V_{PHASE-TA}$ of 0 V, 1 V, and 2 V can be correlated with 0°, 1°, and 2° of phase shift, respectively. As such, the phase shifter circuit 16 can easily determine the phase shift based on the time-advanced modulated phase correction voltage $V_{PHASE-TA}$ and phase-shift the RF signal 12 accordingly.

Figure 2:
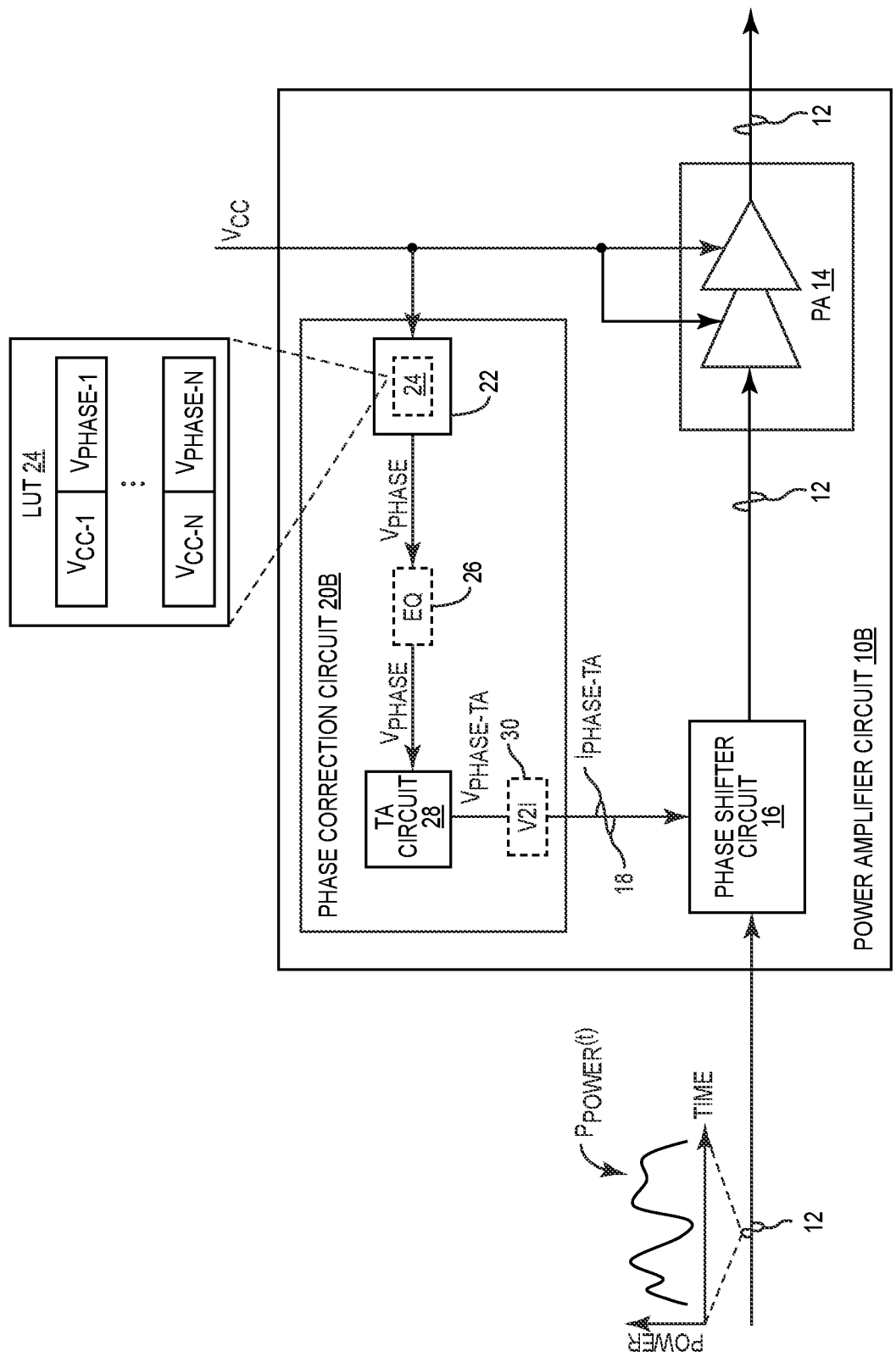
FIG. 2 is a schematic diagram of an exemplary power amplifier circuit configured according to another embodiment of the present disclosure to support phase correction in an RF signal.

Alternative to generating the phase correction signal 18 that includes the time-advanced modulated phase correction voltage $V_{PHASE-TA}$, it is also possible to generate the phase correction signal 18 to include a current. In this regard, FIG. 2 is a schematic diagram of an exemplary power amplifier circuit 10B configured according to an embodiment of the present disclosure to support phase correction in the RF signal 12. Common elements between FIGS. 1 and 2 are shown therein with common element numbers and will not be re-described herein.

The power amplifier circuit 10B includes a phase correction circuit 20B. In an embodiment, the phase correction circuit 20B includes a voltage-to-current (V2I) conversion circuit 30, which may be a transconductance circuit, as an example. The V2I conversion circuit 30 is configured to convert the time-advanced modulated phase correction voltage $V_{PHASE-TA}$ into a time-advanced modulated phase correction current $I_{PHASE-TA}$. Accordingly, the phase correction circuit 20B can generate the phase correction signal 18 that includes the time-advanced modulated phase correction current $I_{PHASE-TA}$.

In an embodiment, the phase shifter circuit 16 can include internal storage (not shown), such as registers for example, to store a correlation between various levels of the time-advanced modulated phase correction current $I_{PHASE-TA}$ and various degrees of phase shift. For example, the time-advanced modulated phase correction current $I_{PHASE-TA}$ of 0 A, 1 A, and 2 A can be correlated with 0°, 1°, and 2° of phase shift, respectively. As such, the phase shifter circuit 16 can easily determine the phase shift based on the time-advanced modulated phase correction current $I_{PHASE-TA}$ and phase-shift the RF signal 12 accordingly.

Figure 3:
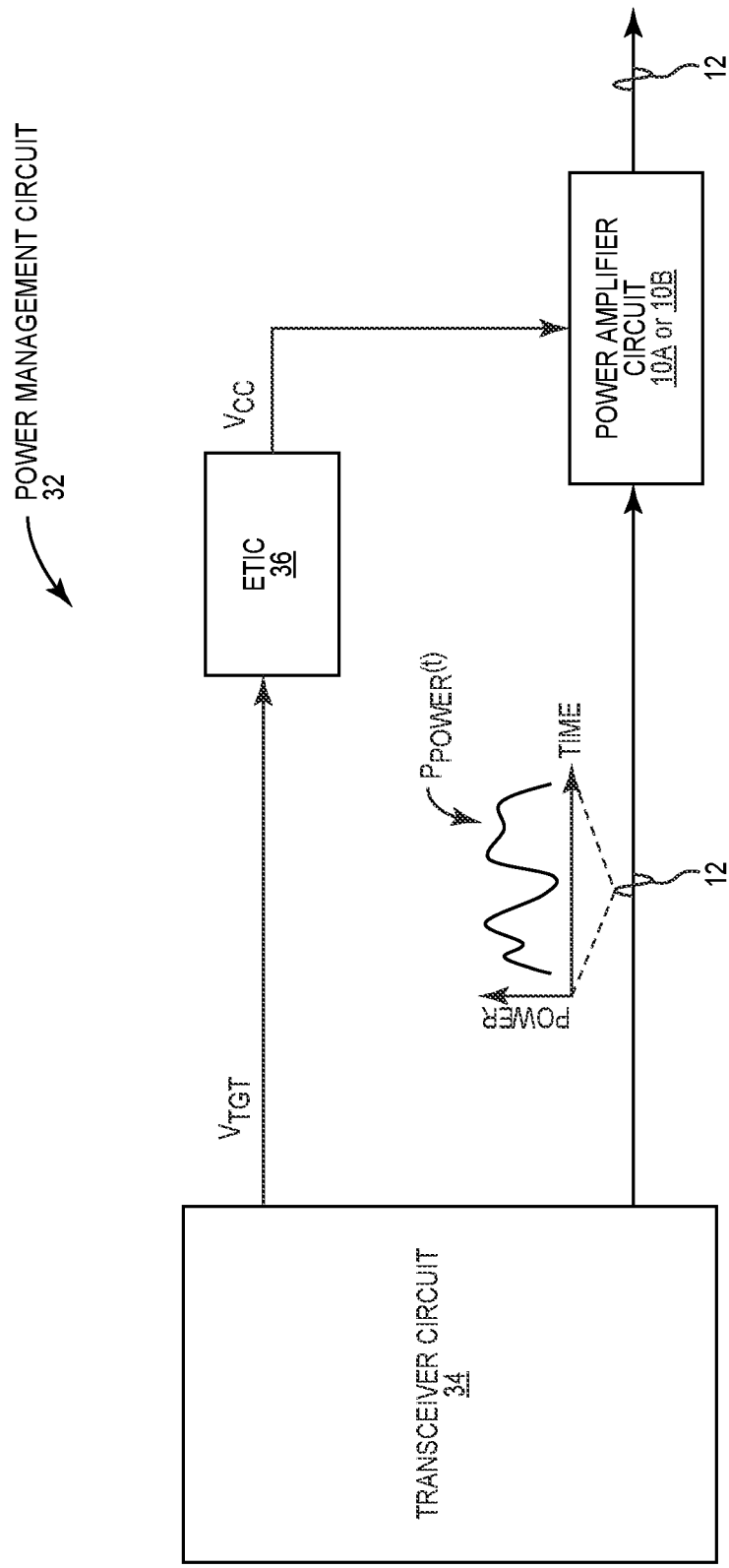
FIG. 3 is a schematic diagram of an exemplary power management circuit that includes any of the power amplifier circuits of FIGS. 1 and 2.

The power amplifier circuit 10A of FIG. 1 and the power amplifier circuit 10B of FIG. 2 can be configured to operate with third party transceiver circuits and power management integrated circuits (PMICs). In this regard, FIG. 3 is a schematic diagram of an exemplary power management circuit 32 that can be configured to include any of the power amplifier circuit 10A of FIG. 1 and the power amplifier circuit 10B of FIG. 2. Common elements between FIGS. 1, 2, and 3 are shown therein with common element numbers and will not be re-described herein.

In an embodiment, the power management circuit 32 includes a transceiver circuit 34 and an envelope tracking integrated circuit (ETIC) 36. The transceiver circuit 34 is configured to generate the RF signal 12 associated with the time-variant power envelope $P_{POWER}(t)$ and a modulated target voltage VTGT that tracks the time-variant power envelope $P_{POWER}(t)$. For exemplary embodiments of the transceiver circuit 34, please refer to APP189. The ETIC 36 is configured to generate the modulated voltage $V_{CC}$ based on the modulated target voltage VTGT.

As previously discussed in FIGS. 1 and 2, the power amplifier circuit 10A and the power amplifier circuit 10B are each configured to generate the modulated phase correction voltage $V_{PHASE}$ based on the modulated voltage $V_{CC}$. In this regard, the power amplifier circuit 10A and the power amplifier circuit 10B can easily operate with the ETIC 36 made by third party vendors, thus allowing a more flexible configuration of the power management circuit 32.

Those skilled in the art will recognize improvements and modifications to the preferred embodiments of the present disclosure. All such improvements and modifications are considered within the scope of the concepts disclosed herein and the claims that follow.

What is claimed is:

1. A power amplifier circuit comprising:
a power amplifier configured to amplify a radio frequency (RF) signal based on a modulated voltage; and
a phase correction circuit configured to generate a phase correction signal based on the modulated voltage to thereby cause a phase change in the RF signal; wherein the phase correction circuit comprises:
a phase correction voltage circuit configured to generate a modulated phase correction voltage based on the modulated voltage; and
a voltage equalizer circuit configured to equalize the modulated phase correction voltage.

2. The power amplifier circuit of claim 1, wherein the power amplifier circuit further comprises a phase shifter circuit coupled to the power amplifier and configured to:
determine a phase shift corresponding to the phase correction signal; and
phase-shift the RF signal based on the determined phase shift.

3. The power amplifier circuit of claim 2, wherein the phase shifter circuit is further configured to adjust an amplitude of the RF signal.

4. The power amplifier circuit of claim 1, wherein:
the phase correction voltage circuit comprises a phase correction voltage lookup table (LUT) comprising a plurality of phase correction voltages each corresponding to a respective level of the modulated voltage; and
the phase correction voltage circuit is further configured to output one of the plurality of phase correction voltages as the modulated phase correction voltage based on the respective level of the modulated voltage.

5. The power amplifier circuit of claim 1 wherein the phase correction circuit further comprises a time advance circuit configured to time advance the modulated phase correction voltage by a selected time advance value to generate a time-advanced modulated phase correction voltage that is time aligned with the modulated voltage.

6. The power amplifier circuit of claim 5, wherein the phase correction circuit is further configured to generate the phase correction signal comprising the time-advanced modulated phase correction voltage.

7. The power amplifier circuit of claim 6, wherein the power amplifier circuit further comprises a phase shifter circuit coupled to the power amplifier and configured to:
determine a phase shift corresponding to the time-advanced modulated phase correction voltage; and
phase-shift the RF signal based on the determined phase shift.

8. The power amplifier circuit of claim 5, wherein the phase correction circuit further comprises a voltage-to-current conversion circuit configured to convert the time-advanced modulated phase correction voltage into a time-advanced modulated phase correction current.

9. The power amplifier circuit of claim 8, wherein the power amplifier circuit further comprises a phase shifter circuit coupled to the power amplifier and configured to:
determine a phase shift corresponding to the time-advanced modulated phase correction current; and
phase-shift the RF signal based on the determined phase shift.

10. A power management circuit comprising:
a power amplifier circuit comprising:
a power amplifier configured to amplify a radio frequency (RF) signal based on a modulated voltage; and
a phase correction circuit configured to generate a phase correction signal based on the modulated voltage to thereby cause a phase change in the RF signal, wherein the phase correction circuit comprises:
a phase correction voltage circuit configured to generate a modulated phase correction voltage based on the modulated voltage; and
a voltage equalizer circuit configured to equalize the modulated phase correction voltage; and
an envelope tracking integrated circuit (ETIC) configured to generate the modulated voltage based on a modulated target voltage.

11. The power management circuit of claim 10, further comprising a transceiver circuit configured to:
generate the RF signal associated with a time-variant power envelope; and
generate the modulated target voltage that tracks the time-variant power envelope.

12. The power management circuit of claim 10, wherein:
the phase correction voltage circuit comprises a phase correction voltage lookup table (LUT) comprising a plurality of phase correction voltages each corresponding to a respective level of the modulated voltage; and
the phase correction voltage circuit is further configured to output one of the plurality of phase correction voltages as the modulated phase correction voltage based on the respective level of the modulated voltage.

13. The power management circuit of claim 10 wherein the phase correction circuit further comprises a time advance circuit configured to time advance the modulated phase correction voltage by a selected time advance value to generate a time-advanced modulated phase correction voltage that is time aligned with the modulated voltage.

14. The power management circuit of claim 13, wherein the phase correction circuit is further configured to generate the phase correction signal comprising the time-advanced modulated phase correction voltage.

15. The power management circuit of claim 14, wherein the power amplifier circuit further comprises a phase shifter circuit coupled to the power amplifier and configured to:
determine a phase shift corresponding to the time-advanced modulated phase correction voltage; and
phase-shift the RF signal based on the determined phase shift.

16. The power management circuit of claim 13, wherein the phase correction circuit further comprises a voltage-to-current conversion circuit configured to convert the time-advanced modulated phase correction voltage into a time-advanced modulated phase correction current.

17. The power management circuit of claim 16, wherein the power amplifier circuit further comprises a phase shifter circuit coupled to the power amplifier and configured to:
determine a phase shift corresponding to the time-advanced modulated phase correction current; and
phase-shift the RF signal based on the determined phase shift.

* * * * *